United States Patent [19]

Pauker

[11] Patent Number: 4,812,785
[45] Date of Patent: Mar. 14, 1989

[54] GYRATOR CIRCUIT SIMULATING AN INDUCTANCE AND USE THEREOF AS A FILTER OR OSCILLATOR

[75] Inventor: Vlad Pauker, Bievres, France

[73] Assignee: U.S. Philips Corporation, New York, N.Y.

[21] Appl. No.: 77,572

[22] Filed: Jul. 24, 1987

[30] Foreign Application Priority Data

Jul. 30, 1986 [FR] France ............... 86 11032

[51] Int. Cl.$^4$ .................. H03B 5/24; H03H 11/08
[52] U.S. Cl. .................. 331/117 FE; 333/215; 331/167
[58] Field of Search ............ 333/214, 215; 331/117 R, 117 FE, 167

[56] References Cited

U.S. PATENT DOCUMENTS

| | | | |
|---|---|---|---|
| 3,643,183 | 2/1972 | Geffe .................... | 333/215 |
| 3,715,693 | 2/1973 | Fletcher et al. .......... | 333/215 |
| 3,921,102 | 11/1975 | Voorman et al. ........ | 333/215 X |

Primary Examiner—Siegfried H. Grimm
Attorney, Agent, or Firm—Michael E. Marion; Gregory P. Gadson

[57] ABSTRACT

A gyrator circuit usable in a resonant filter circuit comprises a first and a second transconductance amplifier circuit, A and B, respectively, having opposite conductances, which amplifiers are arranged in parallel between a first terminal a and a second terminal b and comprise a first capacitance $C_1$ arranged between said first terminal a and an earth terminal m, which gyrator circuit simulates an inductance $L_g$ arranged between said second terminal b and said earth terminal m and comprises means for controlling the quality factor Q of said inductance, characterized in that the first transconductance amplifier circuit A comprises two series-connected inverting amplifier stages $P_1$ and $P_2$, in that the second transconductance amplifier circuit B comprises an inverting amplifier stage $P_3$, and in that the means for controlling the quality factor Q comprise a first means $P_5$ for influencing the output conductance $q_2$ of the gyrator and a second means $P_6$ for influencing the phase shift between the output current and the control voltage of the gyrator.

14 Claims, 7 Drawing Sheets

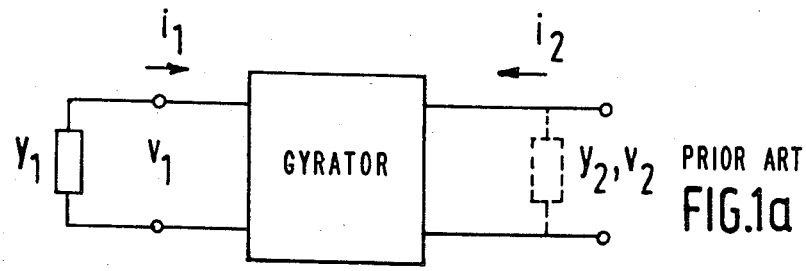
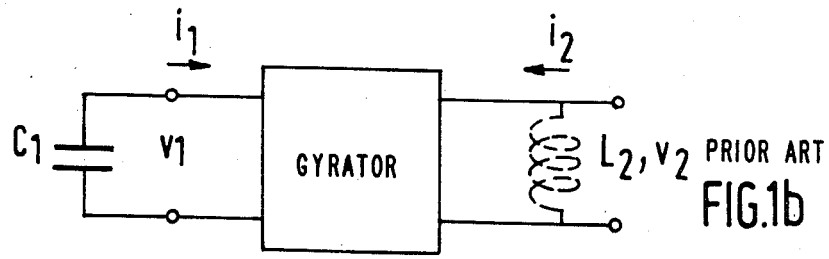
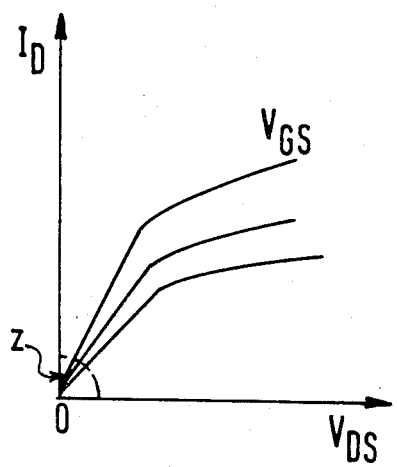
FIG.5
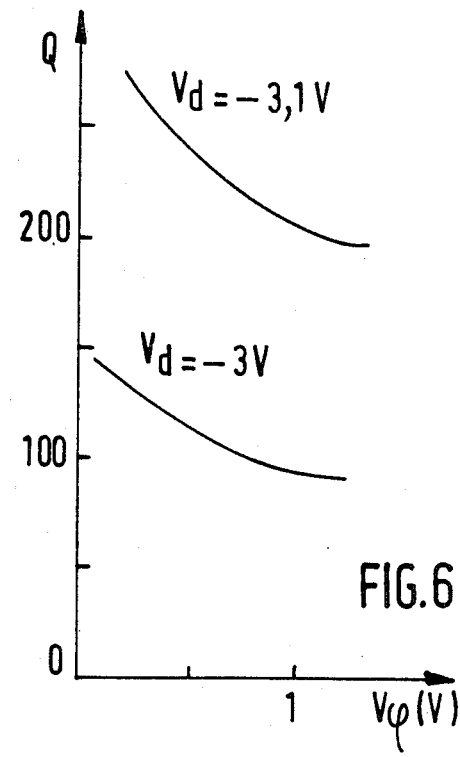
FIG.6

GYRATOR CIRCUIT SIMULATING AN INDUCTANCE AND USE THEREOF AS A FILTER OR OSCILLATOR

BACKGROUND OF THE INVENTION

The invention relates to a gyrator circuit comprising a first and a second transconductance amplifier A and B respectively having opposite conductances, which amplifiers are arranged in parallel between a first terminal a and a second terminal b and comprises a first capacitance $C_1$ arranged between said first terminal a and a third terminal m, which gyrator circuit simulates an inductance $L_g$ arranged between said second terminal b and said third terminal m and comprises means for controlling the quality factor Q of said inductance.

The invention also relates to a resonant circuit including said inductance $L_g$.

The invention is used for constructing filters for microwave frequencies in the range from 2 to 5 GHz and for realising oscillators.

A gyrator circuit which simulates an inductance and which is included in a resonant filter circuit is known from the publication in "IEEE, J. Solid-State Circuits, Vol. SC-15, pp. 963-968, December 1980", from the article entitled "Gyrator Video Filter IC with Automatic Tuning" by Kenneth W. MOULDING et al. This document describes a gyrator circuit comprising two differential amplifiers operated as voltage-controlled current sources having opposite transconductances, which are arranged in parallel head-to-tail and which are loaded by two capacitances. The technology used for realising this circuit utilizes bipolar transistors having such a threshold voltage that a substantial phase shift is produced in the amplifiers, which results in a negative resistance whose absolute value is higher than the positive resistance caused by losses, so that the circuit is susceptible to oscillate. For this reason this circuit is provided with an additional resistance to raise the positive resistance caused by losses in order to compensate for this fault and to preclude oscillation. Since the quality factor of such a circuit is inversely proportional to the resultant of the resistance due to the phase shift and the resistance due to losses, this additional resistance must be very low. In this known circuit said additional resistance is arranged in series with one of the load capacitances of the gyrator and is connected to a bias voltage by means of which the tuning of the resonator can be adjusted.

However, this known circuit should meet the requirement that it can be tuned to a given low frequency, whilst a satisfactory quality factor is maintained. The problems encountered in realising this circuit stem from the spread in characteristics of the component and in particular the realisation of the resistances.

Therefore, in order to render this circuit independent of the problems of the spread in characteristics, an auxiliary gyrator circuit tuned by means of a quartz oscillator is utilised for tuning the filter gyrator and to provide the bias voltage for the capacitances. This system enables the auxiliary gyrator circuit to be controlled in a closed loop but it is based on the fact that the filter gyrator must keep in track.

For the envisaged use at microwave frequencies this known circuit has several drawbacks:

First of all, the operating frequency is too low (<10 MHz);

Further, the spread in characteristics and, in particular, those of the resistors necessitates the use of an auxiliary gyrator.

Finally, the filter gyrator is merely driven by the auxiliary gyrator but not in a controlled manner.

However, for this envisaged use, it is essential that:
the operation frequency is high, i.e. is situated in the range between 2 kHz and 4.0 MHz;
the quality factor is high;
the filter frequency is accurate and the circuit characteristics are reproducible.

In accordance with the invention this object is achieved by means of a circuit as defined in the opening paragraph, which is characterized in that the first transconductance amplifier circuit A comprises two inverting amplifier stages $P_1$ and $P_2$ arranged in series, in that the second transconductance amplifier circuit B comprises an inverting amplifier stage $P_3$, and in that the means for controlling the quality factor Q comprise a first means $P_5$ for influencing the output transconductance $g_2$ of the gyrator and a second means $P_6$ for influencing the phase shift $\phi$ between the output current and the gyrator control voltage.

This gyrator circuit has inter alia the following advantages:

It is possible to use gallium-arsenide FETs and thus to obtain high frequencies.

The two principal circuit parameters, namely the positive resistance due to losses and the negative resistance due to the phase shift are controlled, in contra-distinction to the known device which only comprises a means for influencing the resistance due to losses.

The quality factor is truly controlled.

The quality factor is now very high of the order of 250.

The circuit is simpler than the known device and can be wholly integrated.

For the envisaged use as a resonant circuit to form a filter:
the operating frequency is now very high,
the filter frequency is very accurate.
The characteristics of this circuit are reproducible and consequently suitable for fabrication in large series.

For the envisaged use as an oscillator:
the frequency band which is covered is very wide: 2 to 5 GHz,
the circuit occupies a small area and has a very low power consumption because the transistors and capacitors can be very small.

BRIEF DESCRIPTION OF THE DRAWINGS

Embodiments of the invention will now be described in more detail, by way of example, with reference to the accompanying drawings, in which FIGS. 1a and 1b are equivalent diagrams of a gyrator circuit in general and in the case that the gyrator is loaded by a capacitance respectively, FIG. 5 is a set of characteristics illustrating the operating range of the transistor $T_d$ used as variable resistance, FIG. 6 shows the quality factor Q of the gyrator in a realised embodiment as a function of the control voltages of the transistor $T_d$ used as variable resistance and the diode $D\phi$ used as variable capacitance.

DETAILED DESCRIPTION OF THE INVENTION

The problem posed is as follows:
to filter a frequency of 2 kHz to 40 MHz with a high accuracy,
to achieve this by means of an integrated device having a high quality factor,
to achieve this by means of the device which has a high reliability and is yet cheap enough for use in consumer products.

This object is achieved by means of the gyrator in accordance with the invention. It is to be noted that depending on the values of the characteristics of the elements used for realising this gyrator circuit, this circuit can obviously be used for filtering other frequencies or it can be used as an oscillator, as will be explained hereinafter.

According to the invention, as in the prior-art circuit, the proposed gyrator circuit is used for simulating an inductance in order to realise a resonant circuit constituted by this inductance $L_2$ and a capacitance $C_2$.

In conformity with the operating principle of gyrators as illustrated by the equivalent diagram of such a circuit shown in FIG. 1a, an admittance $y_1$ arranged at the input is related to the output admittance $y_2$ by the expression $$y_2 = g_o^2/y_1$$

where $g_o$ is the gyrator conductance.

Thus, if the input admittance is a capacitance $C_1$ (FIG. 1b), the output impedance is an inductance $L_2$ defined by:

$$y_1 = j\omega C_1 \text{ and } y_2 = g_o^2/j\omega C_1 = 1/j\omega L_2.$$

Figure 3B:
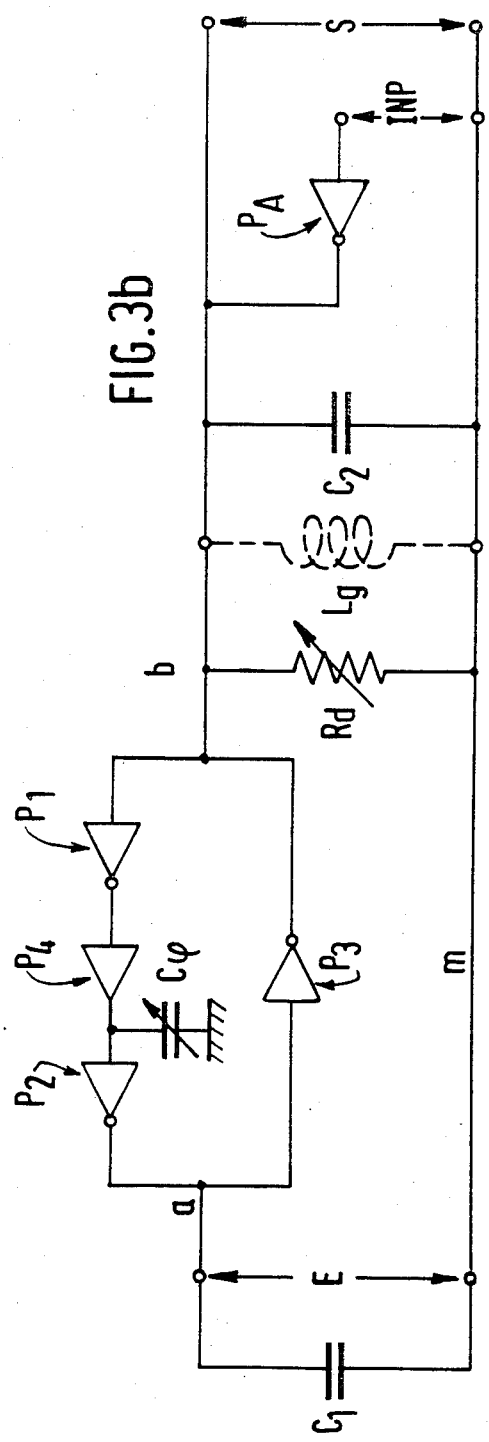
FIG. 3b is the block diagram of a resonant filter circuit in accordance with the invention corresponding to FIG. 2b.
Figure 3A:
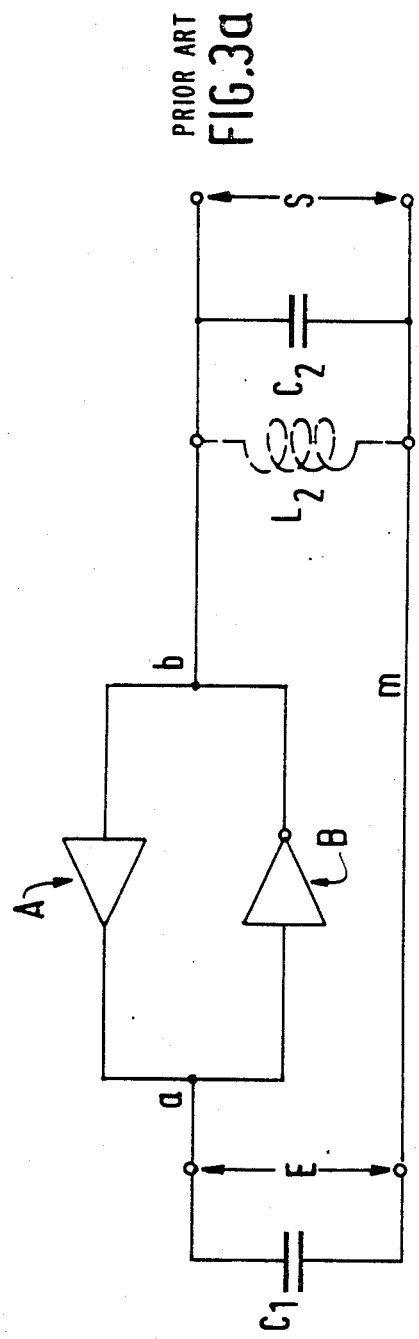
FIG. 3a is the block diagram of a resonant circuit including a gyrator, corresponding to the case of FIG. 1b.

As is known from the prior art, a gyrator comprises two transconductance amplifiers, i.e. voltage-controlled current sources having opposite transconductances, which are arranged in parallel head to tail. Thus, as is shown in FIG. 3a, this gyrator comprises an amplifier A and an inverting amplifier B. The gyration conductance $g_o$ is related to the respective conductances $g_{mA}$ and $g_{mB}$ of each of the amplifiers by the relationship $$g_o^2 = g_{mA} \cdot g_{mB}.$$

The capacitance $C_1$ connected to the input E of the gyrator circuit is thus transformed into the inductance $L_2$ $$L_2 = C_1/g_{mA} \cdot g_{mB}.$$

In the ideal case, in which the capacitance $C_1$ has no losses, the gyrator is without losses, the gyration admittance is real, and the generated inductance $L_2$ is consequently pure.

In the real case of a non-ideal amplifier the overall admittance matrix of the amplifier is $$Y = \begin{vmatrix} y_{11} & y_{12} \\ y_{21} & y_{22} \end{vmatrix}$$

For the gyrator comprising two amplifiers as described above the matrix has the form $$y = \begin{vmatrix} y_{11A} + y_{22B} & y_{21B} + y_{12A} \\ y_{21A} + y_{12B} & y_{22A} + y_{11B} \end{vmatrix} = \begin{vmatrix} y_{11} & y_{12} \\ y_{21} & y_{22} \end{vmatrix}$$

where $$i_1 = y_{11}v_1 + y_{12}v_2$$

$$i_2 = y_{21}v_1 + y_{22}v_2$$

for the input and output currents $i_1$ and $i_2$ as a function of the input and output voltages $v_1$ and $v_2$ as shown in FIG. 1a.

The susceptance components of $jb_{11}$ and $jb_{22}$ of the input and output admittances $y_{11}$ and $y_{12}$ respectively of the gyrator are added to the susceptance of the load capacitance $C_1$ and to the output inductance $L_2$, so that the latter are modified, in particular that $L_2$ takes the value $L_g$.

The conductance components of the admittances $y_{11}$ and $y_{22}$ lead to a reduction of the quality factor of the inductance.

The overall conductance at the input of the gyrator may be expressed by $$g_1 = g_{11A} + g_{22B} + g_C$$

where $g_C$ is the conductance of the capcitance $C_1$.

The conductance at the output of the gyrator is expressed by the relationship $$g_2 = g_{22A} + g_{11B} + g_L$$

where $g_L$ is the conductance of the circuit across which the inductance $L_2$ is arranged.

Taking into account that the term q is very small in comparison with the term $\omega C_1$ and that the phase shift $\phi/2$ defined by $\phi = \text{Arq}(-y_{21} \cdot y_{12})$ is small, (i.e. $\cos \phi \approx 1$ and $\sin \phi \approx \phi$), the two inductances $g_1$ and $g_2$ have the following effect on the output admittances:

$$y_2 = g_2 + g_1(g_o/\omega C_1)^2 + \rho g_o^2/\omega C_1 + j g_o^2/\omega C_1 + jb_{22}$$

which enables the quality factor Q anticipated for this system to be derived by means of the relationship:

$$1/Q \approx g_1/\omega C_1 = g_2 \omega C_1/g_o^2 + \phi \quad (1)$$

The output current of a transconductance amplifier lags the control voltage, so that $\phi \leq 0$ and this phase shift causes the quality factor to increase.

In accordance with the invention the quality factor is controlled and the accuracy of the inductance generated by means of a capacitance is obtained by controlling both the phase shift $\phi$ and the inductance $g_2$.

Figure 2:
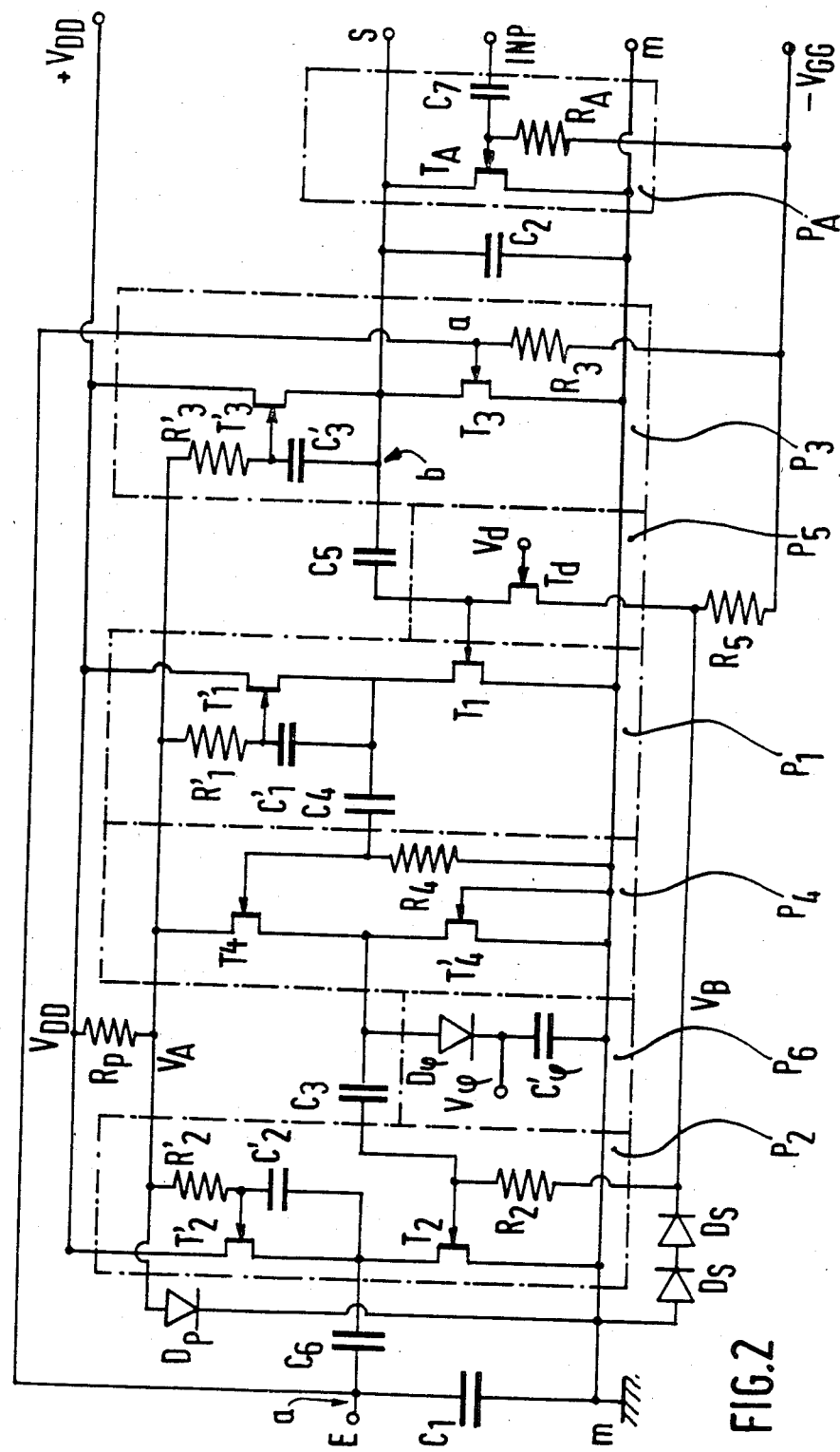
FIG. 2 is the electrical diagram of a resonant filter circuit including a gyrator in accordance with the invention.

As is shown in FIG. 2, the gyrator circuit in accordance with the invention comprises several sections indicated in broken lines. FIG. 3b is an equivalent block diagram of the circuit shown in FIG. 2.

The section $P_2$ as well as the sections $P_1$ and $P_3$ are inverter stages. The section $P_4$ is a buffer stage.

The inverters $P_1$ and $P_2$ are arranged in series with the buffer stage $P_4$ and are equivalent to a non-inverting amplifier such as A (FIG. 3a). The section $P_3$ is equivalent to the inverting amplifier B of FIG. 3a. As is shown in this figure, the amplifiers are of opposite polarity and are arranged in parallel and head to tail between the nodes a and b.

The gyrator transforms the capacitance $C_1$ arranged at the input E between the node a and earth m into an inductance $L_g$ arranged between the node b and earth m. The capacitance $C_2$ arranged in parallel with $L_g$ constitutes the desired resonant circuit LC.

The signal of the frequency F to be filtered, or any other signal for any other use, is applied to the input INP of an amplifier $P_A$ of the gyrator device in accordance with the invention (see FIG. 3b). The filtered signal appears on the output S (see FIGS. 2, 3b, 3c).

Each inverter stage $P_1$, $P_2$, $P_3$ comprises an inverter transistor $T_1$, $T_2$, $T_3$ respectively and an active load $T'_1$, $T'_2$, $T'_3$ respectively. Each stage is d.c. isolated from the preceding and following stages by a capacitance such as $C_3$, $C_4$, $C_5$, $C_6$, and the input INP is also isolated by means of a capacitance $C_7$.

The active loads of each of the inverter stages exhibit a special structure, which is known from U.S. Pat. No. 4,241,316 where it is used for an entirely different purpose.

Here this structure is used in order to improve the performance of each inverter and amplifier stage. The transistors used for realising the circuit in accordance with the invention are suitably field-effect transistors of the MESFET type which have suitable properties for realising circuits operating at high frequencies. Amplifier stages realised by means of these transistors usually have a very low gain, which gain is improved in known manner by the use of an active load.

The use of an active load has the advantage that it provides a load with a wide dynamic range, which is favourable for the gain, which is proportional to the load, and that it provides a smaller d.c. load, so that the gain is not reduced by an excessive direct current.

Although the use of the active load requires a very precise biasing of the two series-connected transistors, i.e. the inverter transistor and the load transistor, these two transistors each behave as two series-connected current sources. In such an arrangement the smallest difference in bias may result in either the one or the other of these transistors going out of saturation.

Figure 4A:
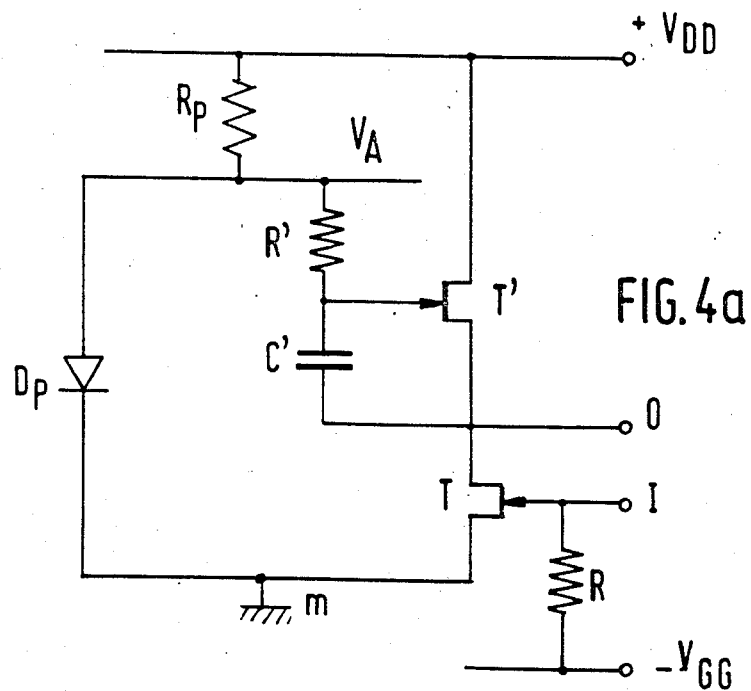
FIG. 4a is the electrical diagram of an inverting amplifier stage of the gyrator in accordance with the invention.

For this reason the active load constituted by each of the transistors T' in each inverting amplifier stage of the circuit in accordance with the invention is biased as shown in FIG. 4a. The load transistor T' is connected in common drain arrangement to the positive d.c. supply $V_{DD}$, its source being connected to the junction point of the drain of the inverter transistor T and the output O of the inverter stage. The inverter transistor T is arranged in such a way that its source is connected to earth and its gate, to which the input signal I of the stage is applied, is biased by a resistor R arranged between I and a negative potential $-V_{GG}$. The gate of the load transistor T' is biased by means of a resistor R' connected to the positive power supply $V_A$ and by means of a capacitor C' connected to point O.

Since the stage is powered by d.c. supplies constituted by earth potential, $V_{DD}$ and $-V_{GG}$, the d.c. supply $V_A$ is clamped relative to these supply voltages. The voltage $V_A$ is taken from the junction point between the resistor Rp and the level-shifting diode Dp, the resistor Rp being also connected to the voltage $V_{DD}$ and the diode Dp being connected to earth. Specially, for the stages $P_1$ and $P_2$ a voltage $-V_B$ defined by $-V_{GG} < -R_B < 0$ is clamped in the same way as $V_A$, i.e. relative to earth by a diode Ds and relative to $-V_{GG}$ by a resistor $R_s$ (see FIG. 2).

Figure 4B:
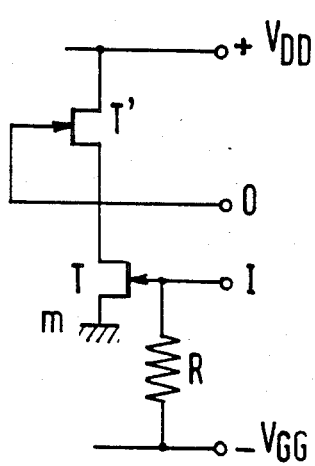
FIGS. 4b and 4c are equivalent diagrams for the diagram of FIG. 4a in the case of a.c. operation and in the case of d.c. operation respectively.

For a.c. operation the inverter stage provided with such a load may be considered to behave as the circuit shown in FIG. 4b, i.e. one with a conventional active load.

Figure 4C:
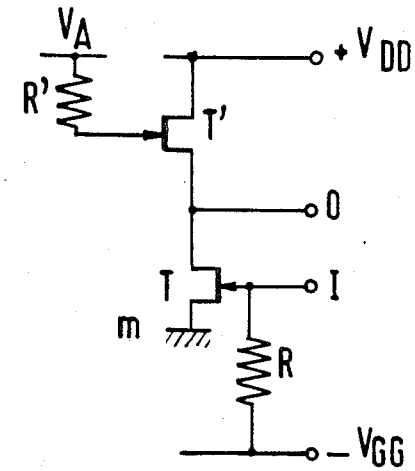

However, for d.c. operation the inverter stage may considered to behave as the circuit shown in FIG. 4c. The transistor T' then behaves as a follower transistor i.e. its source voltage follows the voltage $V_A$. This means that it not only functions as a current source as described in the foregoing, but also as a voltage source having a low output impedance. The inverter stage not only comprises two series-connected current sources as is known, but also a current source (T) in series with a voltage source (T'). In this way the operation of each inverter stage is optimized. Each stage comprises the elements T', R', C', R. i.e. T'$_2$, R'$_2$, C'$_2$ R$_2$ for P$_1$ and T'$_3$, R'$_3$, C'$_3$, R$_3$ for P$_3$. However, in the stage P$_1$ only the elements T'$_1$, R'$_1$, C'$_1$ are elements corresponding to those in the above arrangement. Indeed, the device in accordance with the invention, by means of which the phase shift introduced by the gyrator can be controlled, comprises two sections $P_5$ and $P_6$ indicated in broken lines in FIG. 2. The section $P_5$ is exactly connected to the gate of the transistor $T_1$ in the position expected for a resistance $R_1$ in conformity with the diagram of FIG. 4a.

The section $P_5$ for controlling the phase shift of the gyrator in accordance with the invention comprises a transistor $T_d$ whose drain is connected to the gate of a transistor $T_1$, whose source is connected to the voltage $-V_B$ and whose gate is at a control voltage $V_d$ (see FIG. 2). This voltage $V_d$ is such that the transistor $T_d$ operates in a region where its drain current $I_b$ is approximately zero (but equal to 0 for d.c. operation), for example in the region Z indicated in broken lines in FIG. 5, which gives characteristic curves representing $I_D$ as a function of the drain-source voltage $V_{DS}$ for different gate-source voltages $V_{GS}$.

Under these conditions the transistor $T_C$ operates in a region where its characteristics are linear and behaves as a variable resistance $R_d$ whose value is controlled electrically by the voltage Vd (see FIG. 3b).

During a.c. operation this resistance $R_d$ is connected in parallel with the output S and enables the output conductance $g_2$ of the gyrator to be controlled.

The section $P_6$ enables the phase shift $\phi$ of the gyrator to be influenced. As is shown in FIG. 2, the section $P_4$ of the gyrator comprises a buffer stage comprising a transistor $T_4$ connected in common drain arrangement to $V_{DD}$ and a current-source transistor $T'_4$ whose short-circuited source and gate are connected to earth. The section $P_6$ comprises a diode $D\phi$ in series with a capacitance $C'\phi$, which arrangement is connected between the junction point between the transistors $T_4$ and $T'_4$ of the buffer stage and earth. Thus, the section $P_6$ constitutes a variable capacitance $C\phi$ whose value is a function of the control voltage $V\phi$ applied to the junction point between the diode $D\phi$ and the capacitance $C'\phi$.

In equation (1), which gives the quality factor of the gyrator, the term $g_2$ is controlled by the variable resistance $R_d$. This resistance varies, causing the term $g_2$ to increase, which results in the quality factor Q being reduced.

Also in said equation (1) the variable capacitance $C\phi$ causes the absolute value of the phase shift $\phi$ to increase, so that the quality factor Q increases.

These two effects are balanced to provide absolute control of the elements and characteristics of the gyrator in accordance with the invention.

The amplifier PA, to whose input INP the signal F to be filtered is applied, is an inverting amplifier stage. This stage (see FIG. 2) comprises a transistor $T_A$ having its load in common with the transistor $T_3$ and biased relative to the negative voltage $-V_{GG}$ by means of the resistor $R_A$.

This system enables the circuit to be realised by means of field-effect transistors of the MESFET type, which is particularly advantageous for high-frequency operation.

In a practical embodiment of a gyrator intended for filtering, the circuit in accordance with the invention comprises elements whose values are given in Table I, where W is the gate width of the transistors, $V_{DD} = +5.8$ V, $-V_{GG} = -1.4$ V, the cut-off voltage
$V_T = -2.5$ V for all the transistors, and the gate length
$1 = 0.7$ μm for all the transistors.

FIG. 6 shows the values obtained for the quality factor Q as a function of the values of the control voltages $V\phi$ and $V_d$ of the two adjusting elements of the gyrator in accordance with the invention. On an average this quality factor lies between 100 and 250.

The entire circuit can be constructed as a monolithic integrated circuit on a material of the group III-V, such as for example gallium-arsenide. If it is realised by means of the elements as specified in Table I, it will occupy an area of approximately 0.25 mm² and can operate in a frequency range between 40 MHz and 2 kHz.

TABLE I

| Transistors W(μm) | | Capacitances G(pF) | | Resistances R(kΩ) | |
|---|---|---|---|---|---|
| $T'_2, T_2$ | 30 | $C_6$ | 1 | $R'_2$ | 10 |
| $T_4$ | 30 | $C'_2$ | 0.3 | $R_2$ | 10 |
| $T'_4$ | 15 | $C'_4, C_4$ | 0.3 | $R_p$ | 20 |
| $T'_1$ | 30 | $C_5, C'_3$ | 0.3 | $R_4$ | 10 |
| $T_1$ | 20 | $C_1, C_2$ | 0.50 | $R'_1$ | 10 |
| $T_D$ | 5 | $C_7$ | 1 | $R'_3$ | 10 |
| $T'_3$ | 20 | $C'\phi$ | 1 | $R_3$ | 10 |
| $T_3$ | 10 | | | $R_S$ | 2 |
| $T_A$ | 10 | | | $R_A$ | 20 |
| $D\phi$ | 30 | | | | |
| $D_S$ | 12 | | | | |

TABLE I-continued

| Transistors W(μm) | | Capacitances G(pF) | Resistances R(kΩ) |
|---|---|---|---|
| $D_p$ | 12 | | |

Since the parameters $\phi$ and $g_2$ of the circuit in accordance with the invention can be controlled completely, this circuit may be used for other applications and, if the appropriate elements are provided, it may also be used as an oscillator. For this purpose the section $P_6$ of the circuit enables the negative resistance necessary for oscillation to be obtained. The oscillation frequency is controlled by simultaneously varying the input and output capacitances $C_1$ and $C_2$, which are suitably VARICAPS.

In this case the gyration and tuning capacitances $C_1 = C_2$ are always identical. Their values are chosen in such a way that the factor $1/Q < D$ over the entire band of oscillation frequencies.

One of the special features of this variant of the invention is that the output amplifiers $P_A$ is dispensed with in comparison with the gyrator circuit shown in FIG. 2 and in FIG. 3b.

As is known, the oscillation frequency of an oscillator follows from the equation $$f_{osc} = \frac{1}{2\pi \sqrt{L_2 C_2}}$$

If $L_2$ is fixed, as is the case in a conventional oscillator known to those skilled in the art, the oscillation frequency may be expressed by $$f_{osc} = \frac{K'}{\sqrt{C_2}} \quad \text{(prior art)}$$

where $K'$ is a constant. However, in accordance with the invention, because $L_2$ is variable, the oscillation frequency complies with $$f_{osc} = \frac{K''}{\sqrt{C_1 C_2}} = \frac{K''}{C} \quad \text{assuming that } C_1 = C_2 = C$$

This is a substantial advantage in comparison with the prior art, because high oscillation frequencies can be obtained easily by means of very small capacitors and in integrated circuits the area occupied by the capacitors poses a considerable problem, even such that certain capacitances of large values cannot be integrated, so that the advantage of the circuit in accordance with the invention when used as an oscillator is obvious.

The oscillator in accordance with the invention has further advantages. In particular, it is known that for a high quality factor the transconductance amplifiers should introduce only low losses. This requirement is met if transistors of small dimensions ($\phi_d$ very small) are selected.

The self-impedance simulated by the gyrator in accordance with the invention, whose value is given by $$L_2 = C/\phi_{mA} \cdot \phi_{mB},$$

is then high enough because $g_{mA}$ and $g_{mB}$ are small. As already stated, this means that the capacitances C must be small.

Figure 7A:
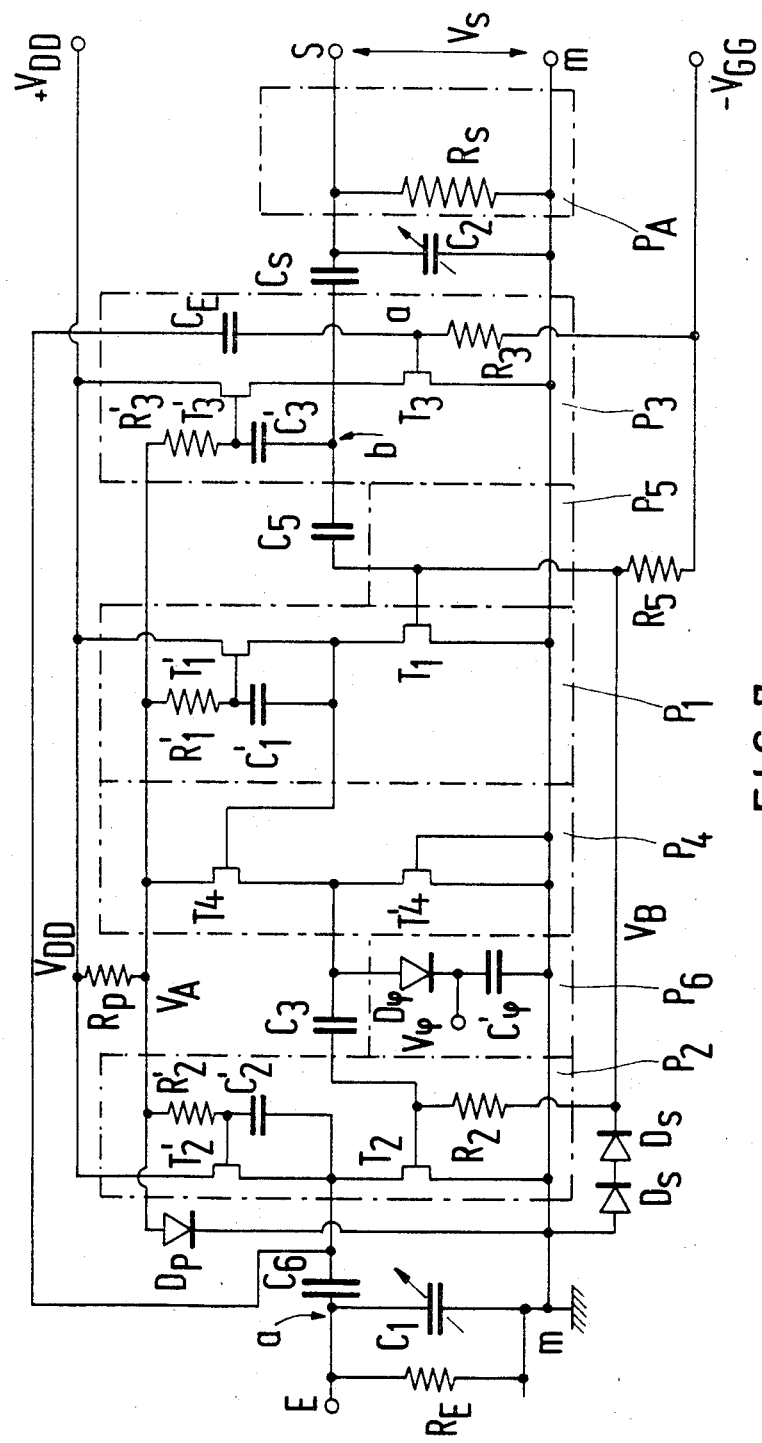
FIGS. 7a and 7b show two examples of the oscillator circuit in accordance with the invention.

In an embodiment of the invention very high frequencies are obtained when the gyrator circuit is used as an oscillator comprising field-effect transistors of the MESFET type and in which all the components are very small. Apart from the advantage of high frequencies, the circuit is very compact and has a low power consumption. The characteristics of this circuit are given in Table II and the diagram of the oscillator circuit is shown in FIG. 7a.

TABLE II

| Transistors | | Capacitances | | Resistances | |
|---|---|---|---|---|---|
| Reference | W(μm) L(μm) | Reference | C(pF) | Reference | R(kΩ) |
| $T_1$ | 20 × 0.7 | $C_6$ | 2 | $R_E$ | 30 |
| $T'_1$ | 20 × 0.7 | $C_E$ | 2 | $R_S$ | 30 |
| $T_2$ | 15 × 0.7 | $C_S$ | 2 | $R_2$ | |
| $T'_2$ | 15 × 0.7 | $C_3$ | 2 | $R_3$ | |
| $T_3$ | 15 × 0.7 | $C_5$ | 2 | $R'_2$ | |
| $T'_3$ | 15 × 0.7 | $C'\phi$ | 0.075 | $R'_3$ | 25 |
| $T_4$ | 20 × 0.7 | $C'_2$ | 0.5 | $R'_1$ | |
| $T'_4$ | 30 × 0.7 | $C'_1$ | 0.5 | $R_5$ | |
| $D_1$ | 15 × 10 | $C'_3$ | 0.5 | | |
| $D_2$ | 15 × 10 | | | | |
| $D\phi$ | 30 | | | | |
| $D_S$ | 12 | | | | |

It is to be noted that resistors $R_E$ and $R_S$ have been added in parallel with $C_1$ and $C_2$ and that isolation capacitors $C_E$ and $C_S$ have also been added.

Figure 8:
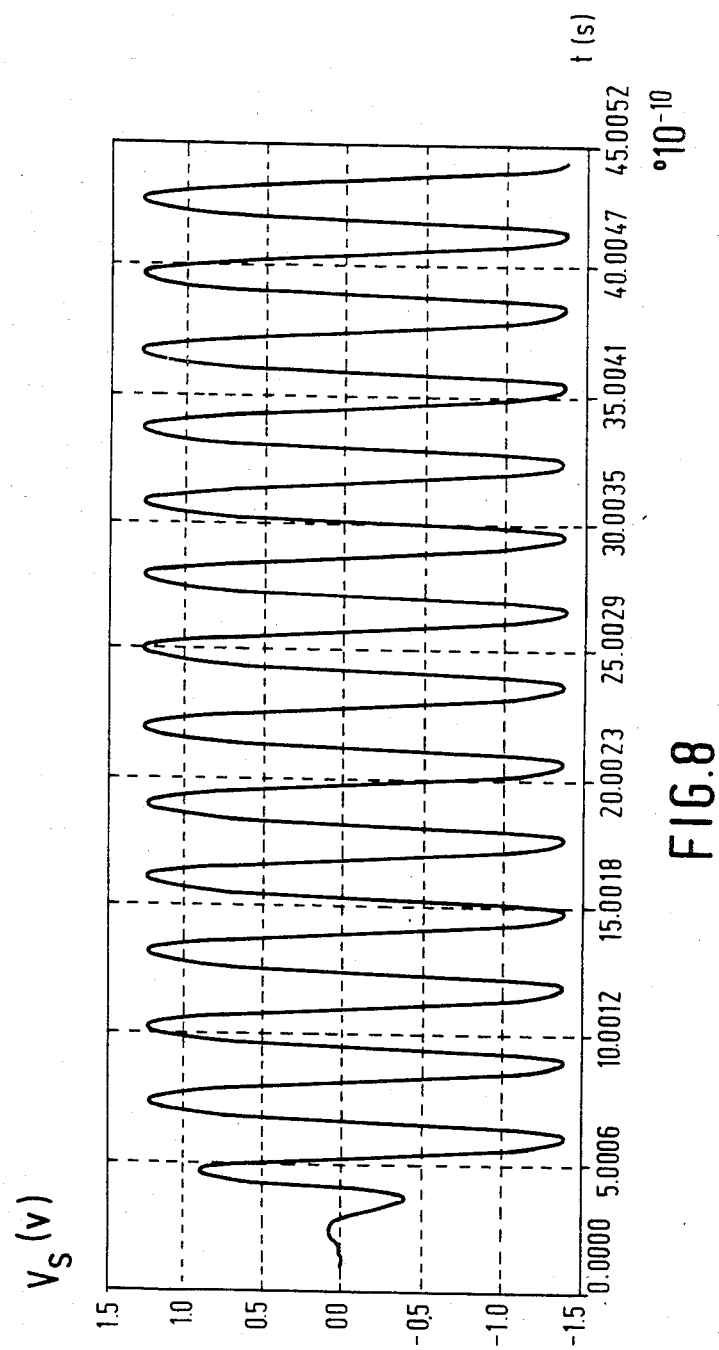
FIG. 8 shows the waveform obtained by means of an embodiment of this oscillator circuit.

The stage $P_5$ may be dispensed with. The power consumption of the circuit is then 100 mW. The frequency band is 2 GHz to 5 GHz. FIG. 8 shows the waveform of the output signal $V_S$ (in V) at 3 GHz.

Figure 7B:
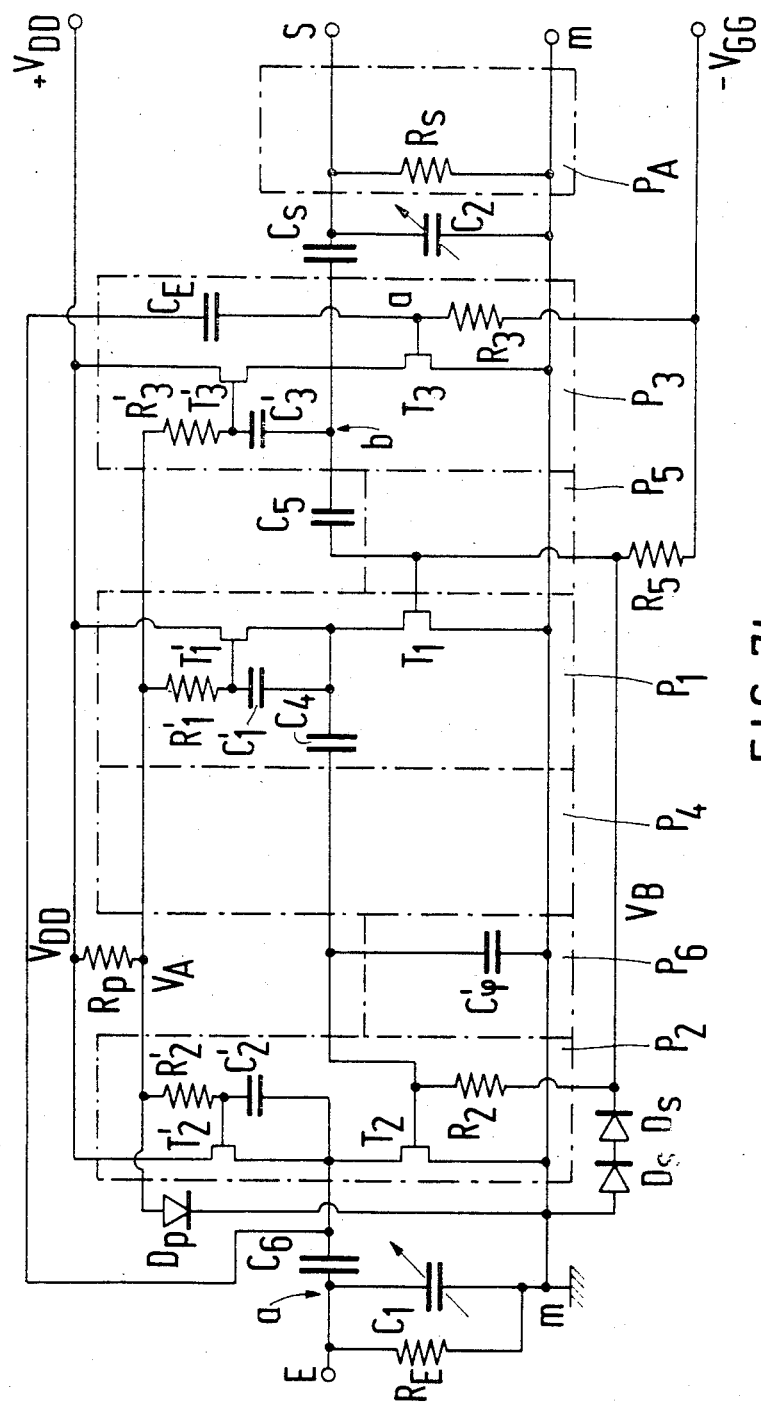

In another embodiment of the gyrator used as an oscillator and shown in FIG. 7b the stage $P_4$ has been dispensed with, all the transistors have a length of 10 μm, and the power consumption is 40 mW. However, the frequency band is slightly smaller and is centred about 2.8 GHz–3.5 GHz.

What is claimed is:

1. A gyrator circuit comprising a first and a second transconductance amplifier A and B respectively having opposite conductances, which amplifiers are arranged in parallel between a first terminal a and a second terminal b and comprises a first capacitance $C_1$ arranged between said first terminal a and a third terminal m, which gyrator circuit simulates an inductance $L_g$ arranged between said second terminal b and said third terminal m and comprises means for controlling the quality factor Q of said inductance, characterized in that the first transconductance amplifier A comprises two inverting amplifier stages $P_1$ and $P_2$ arranged in series, in that the second transconductance amplifier B comprises an inverting amplifier stage $P_3$ and in that the means for controlling the quality factor Q comprises a first means $P_5$ for influencing an output conductance $g_2$ of the gyrator and a second means $P_6$ for influencing the phase shift $\phi$ between an output current and a gyrator control voltage.

2. A circuit as claimed in claim 1, characterized in that the first means $P_5$ for influencing the output conductance $g_2$ is a variable resistance $R_d$ coupled to the output of the gyrator between said second terminal b and said third terminal m, and in that the second means $P_6$ for controlling the phase shift $\phi$ is a variable capacitance $C\phi$ arranged between the input of the second one $P_2$ of the two series-connected inverting amplifiers and said third terminal m.

3. A circuit as claimed in claim 2, characterized in that the variable resistance $R_d$ comprises a field-effect transistor $T_d$ which is controlled by a voltage $V_d$ which varies in a range such that the transistor Td has a drain-source voltage near zero, and in that the variable capacitance $C\phi$ comprises a diode $D\phi$ in series with a fixed capacitance $C'\phi$ and is controlled by a variable voltage $V\phi$ applied to the junction point between the diode $D\phi$ and the fixed capacitance $C'\phi$, the anode of the diode being coupled to the input of the second one $P_2$ of the two inverting amplifiers and the other end of the fixed capacitance $C'\phi$ being coupled to the third terminal m.

4. A circuit as claimed in claim 3, characterized in that each inverter stage $P_1$, $P_2$ and $P_3$ comprises a field-effect transistor $T_1$, $T_2$, $T_3$, respectively, referred to as inverter transistor, whose source is coupled to said third terminal m which is at earth potential, whose drain is coupled to a d.c. supply voltage $+V_{DD}$ via a load, and whose gate receives the input signal I of the inverter stage, the inverted output signal O being available on the drain of the inverter transistor, and in that the output of the inverting stage $P_1$ is isolated from the input of the inverting stage $P_2$ by a buffer stage $P_4$ comprising two field-effect transistors $T_4$ and $T'_4$ arranged in cascode between the earthed third terminal m and the d.c. supply voltage $+V_{DD}$, the lower transistor $T'_4$ being arranged as a current source, the signal from the first inverter stage being applied to the gate of the upper transistor $T_4$ which is biased relative to earthed terminal m by means of a resistor $R_4$, and the signal taken from the junction point between the transistors $T_4$ and $T'_4$ being applied to the input of the second inverter stage $P_2$, which input is also coupled to earthed terminal m via the variable capacitance $C\phi$, the various stages being d.c. isolated from each other by means of capacitances.

5. A circuit as claimed in claim 4, characterized in that in each inverter stage $P_1$, $P_2$ and $P_3$ the load of the inverter transistor $T_1$, $T_2$, $T_3$ respectively is an active load comprising a field-effect transistor $T'_1$, $T'_2$, $T'_3$, respectively, whose gate is brought at a d.c. potential $V_A$ such that $V_m < V_A < V_{DD}$ by means of a resistor $R'_1$, $R'_2$, $R'_3$ respectively and is coupled to the inverter transistor of the stage via a capacitance $C'_1$, $C'_2$, $C'_3$, respectively, and in that the gate of the inverter transistor is biased relative to a negative potential $-V_{GG}$ via a resistor $R_1$, $R_2$, $R_3$, respectively.

6. A circuit as claimed in claim 5, characterized in that the voltage $V_A$ is fixed at the desired value between earth potential and the d.c. supply $V_{DD}$ by a shaft in level by means of a diode $D_p$ and a voltage drop across a resistor $R_p$, and in that the negative voltage $-V_{GG}$ is fixed relative to earth potential by a shift in level by means of a diode $D_S$, said voltage $-V_{GG}$ being also adjusted by a voltage drop across a resistor $R_5$.

7. A resonant circuit of the LC type, characterized in that it comprises an inductance $L_g$ simulated by a gyrator circuit, said gyrator circuit comprising a first and a second transconductance amplifier A and B respectively having opposite conductances, which amplifiers are arranged in parallel between a first terminal a and a second terminal b and comprises a first capacitance $C_1$ arranged between said first terminal a and a third terminal m, which gyrator circuit simulates an inductance $L_g$ arranged between said second terminal b and said third terminal m and comprises means for controlling the quality factor Q of said inductance, characterized in that the first transconductance amplifier A comprises two inverting amplifier stages $P_1$ and $P_2$ arranged in series, in that the second transconductance amplifier B comprises an inverting amplifier stage $P_3$ and in that the means for controlling the quality factor Q comprises a first means $P_5$ for influencing an output conductance $g_2$ of the gyrator and a second means $P_6$ for influencing the phase shift $\phi$ between an output current and a gyrator control voltage; and said resonant circuit further comprising a second capacitance $C_2$ connected between the second terminal b and the third terminal m.

8. A circuit as claimed in claim 7, characterized in that all the elements are monolithically integrated on a substrate of a semiconductor material comprising a compound formed from elements selected from Groups III and V.

9. A resonant filter circuit as claimed in claim 7, characterized in that it loads an amplifier $P_A$.

10. The circuit as claimed in claim 8 wherein said compound is gallium arsenide.

11. An oscillator, characterized in that it comprises a resonant circuit of the LC-type in which an inductance $L_g$ is simulated by a gyrator circuit, said gyrator circuit comprising a first and a second transconductance amplifier A and B respectively having opposite conductances, which amplifiers are arranged in parallel between a first terminal a and a second terminal b and comprises a first capacitance $C_1$ arranged between said first terminal a and a third terminal m, which gyrator circuit simulates an inductance $L_g$ arranged between said second terminal b and said third terminal m and comprises means for controlling the quality factor Q of said inductance, characterized in that the first transconductance amplifier A comprises two inverting amplifier stages $P_1$ and $P_2$ arranged in series, in that the second transconductance amplifier B comprises an inverting amplifier stage $P_3$ and in that the means for controlling the quality factor Q comprises a first means $P_5$ for influencing an output conductance $g_2$ of the gyrator and a second means $P_6$ for influencing the phase shift $\phi$ between an output current and a gyrator control voltage; said resonant circuit further comprising a second capacitance $C_2$ connected between the second terminal b and the third terminal m; and the oscillation frequency is chosen by varying the capacitances $C_1$ and $C_2$.

12. An oscillator as claimed in claim 11, characterized in that the capacitances $C_1$ and $C_2$ are VARICAPS.

13. An oscillator as claimed in claim 11, characterized in that the stage $P_1$ includes a transistor $T_1$ having a gate coupled to an output S via a capacitance $C_5$ and to the voltage $-V_{GG}$ via a resistance $R_5$.

14. An oscillator as claimed in claim 13, characterized in that the stage $P_1$ includes a transistor $T'_1$ having a source electrode connected to a drain electrode of transistor $T_1$, and the common drain-source terminal of transistors $T'_1$ and $T_1$ is coupled directly to the means $P_6$ and the stage $P_2$.

* * * * *